United States Patent [19]

Ducellier et al.

[11] Patent Number: 5,654,822
[45] Date of Patent: Aug. 5, 1997

[54] OPTICAL AMPLIFIER WITH LOW CROSSTALK AND COMPONENT INCLUDING THIS AMPLIFIER

[75] Inventors: Thomas Ducellier, Orsay; Pierre Doussiere, Saint Germain les Arpajons, both of France

[73] Assignee: Alcatel N.V., Rijswijk, Netherlands

[21] Appl. No.: 700,831

[22] Filed: Aug. 21, 1996

[30] Foreign Application Priority Data

Aug. 24, 1995 [FR] France ........................... 95-10057

[51] Int. Cl.$^6$ ........................... H01S 3/00; H01S 3/08
[52] U.S. Cl. ........................... 359/344; 359/337; 372/102
[58] Field of Search ........................... 359/344, 341, 359/337; 372/102

[56] References Cited

U.S. PATENT DOCUMENTS

| | | | |
|---|---|---|---|
| 4,942,366 | 7/1990 | Toda | 330/4.3 |
| 5,019,787 | 5/1991 | Carlson et al. | 330/4.3 |
| 5,239,410 | 8/1993 | Nishimura et al. | 359/344 |
| 5,321,718 | 6/1994 | Waarts et al. | 372/108 |
| 5,323,404 | 6/1994 | Grubb | 372/6 |
| 5,349,602 | 9/1994 | Mehuys et al. | 372/98 |
| 5,541,766 | 7/1996 | Mizrahi et al. | 359/337 |
| 5,550,671 | 8/1996 | Simpson et al. | 359/337 |

FOREIGN PATENT DOCUMENTS

| | | |
|---|---|---|
| 0639876A1 | 2/1995 | European Pat. Off. |
| WO9522847 | 8/1995 | WIPO |

OTHER PUBLICATIONS

J. F. Massicott et al, "1480nm pumped erbium doped fibre amplifer with all optical automatic gain control", *Electronics Letters*, vol. 30, No. 12, Jun. 9, 1994, Stevenage, GB, pp. 962–963, XP002001978.

R. Kashyap et al, "Wavelength Flattened Saturated Erbium Amplifier Using Multiple Side–Tap Bragg Gratings", *Electronics Letters*, vol. 29, No. 11, May 27, 1993, Stevenge, GB, pp. 1025–1026, XP0003729636.

L. F. Tiemeijer et al, "Reduced Intermodulation Distortion in 1300 Nm Gain–Clamped MQW Laser Amplifiers", *IEEE Photonics Technology Letters*, vol. 7, No. 3, Mar. 1, 1995, NY, US, pp. 284–286, XP000510272.

*Patent Abstracts of Japan*, vol. 018, No. 326 (E–1565) Jun. 21, 1994, corresponding to JP-A-06 077571 (Nippon Telegr & Telph Corp) dated Mar. 18, 1994.

*Primary Examiner*—Mark Hellner
*Attorney, Agent, or Firm*—Sughrue, Mion, Zinn, Macpeak & Seas

[57] ABSTRACT

A semiconductor substrate includes an active waveguide to guide optical signals to be amplified occupying signal channels within a gain band of the waveguide. A stabilizer system comprises two Bragg reflectors tuned to a resonant wavelength in the gain band but outside the signal channels. It includes a gain segment in a resonant cavity. Two rejector Bragg reflectors sandwiching the resonant cavity between them are tuned to the resonant wavelength. Applications include telecommunication systems.

5 Claims, 1 Drawing Sheet

OPTICAL AMPLIFIER WITH LOW CROSSTALK AND COMPONENT INCLUDING THIS AMPLIFIER

BACKGROUND OF THE INVENTION

1. Field of the Invention

The present invention concerns wavelength division multiplex guided optical telecommunication systems. It is directed in particular to minimizing crosstalk between the various spectral channels occupied by the signals to be transmitted.

2. Description of the Prior Art

This requires low crosstalk optical amplifiers. Prior art amplifiers of this kind comprise optically pumped erbium doped optical fibers. They have the drawback of being difficult to integrate with semiconductor optical components.

Other optical amplifiers are in semiconductor form. One amplifier of this kind includes;

an active waveguide formed in a semiconductor substrate to guide a multiplex made up of optical signals to be amplified occupying respective signal channels in the spectrum, the gain band of the waveguide including said signal channels, two layers of two opposite conductivity types (N and P) formed in the substrate on opposite sides of the guide to enable a supply electrical current to inject charge carriers into the waveguide, and electrodes through which said supply electrical current enters a segment of the length of the waveguide constituting a gain segment.

Unfortunately an amplifier of this kind features high crosstalk up to modulation frequencies of several gigahertz, at least when the amplifier is operating near saturation. To a first approximation the gain is a linear function of the electrical charge carrier density in the active waveguide. This carrier density is the result of equilibrium in between the injection of carriers by a supply electrical current and the recombination of these carriers by stimulated emission related to the amplification of the input multiplex. Any modification of the overall power of the multiplex modifies the carrier density and therefore the gain of the amplifier. As this power increases the gain decreases. Conversely, as it decreases, the gain returns to its initial value.

These gain variations are very fast. After an instantaneous interruption of the input multiplex the time to recover the gain is in the order of 200 picoseconds. The gain therefore varies with the binary data modulating the amplified signals, despite the very high modulation frequency usually employed in optical telecommunications. These fluctuations in the gain generate said crosstalk between the various channels.

This crosstalk could be reduced by operating the amplifier far below saturation. This would reduce the signal to noise ratio, however, which would degrade transmission quality.

This is why, to limit crosstalk, one prior art semiconductor optical amplifier further includes a stabilizer system comprising two or at least one Bragg reflector coupled to said waveguide and having lines of equal index perpendicular to the direction of the waveguide. This system is tuned to a resonant wavelength included in said gain band but outside said signal channels. It includes the gain segment in a resonant cavity to sustain therein optical oscillation at this wavelength.

As soon as this stabilizing oscillation is present, the gain of the active material is locked at the level required to compensate the losses of the cavity, and no longer varies with the incoming power: the amplitude variations of the input multiplex are compensated by the amplitude variations of the stabilizing oscillation.

One such prior art low crosstalk amplifier is known as a "stabilized gain" amplifier. It is described in French patent application 93 10147 filed 20 Aug. 1993 (publication No. 2 709 189).

Despite the advantages it has over prior art amplifiers, it has become clear that the operation of telecommunication systems using this low crosstalk amplifier is less than optimal in some cases.

The present invention has the following aims:

to improve the operation of a telecommunication system using low crosstalk amplifiers, to limit the cost of these amplifiers, and to facilitate the implementation of such systems by enabling simple fabrication of integrated components including such amplifiers.

SUMMARY OF THE INVENTION

The present invention consists in a low crosstalk optical amplifier comprising:

a waveguide formed in a semiconductor substrate to guide a multiplex comprising a plurality of optical signals to be amplified occupying respective signal channels in the spectrum, said guide means being adapted to recombine charge carriers of two opposite conductivity types to provide a gain for optical waves in a spectral band constituting a gain band including said signal channels, said waveguide having a length and a direction at each point, two layers of two opposite conductivity types (N and P) formed in said substrate on opposite sides of said waveguide to enable a supply electrical current to inject said charge carriers into said waveguide, electrodes through which an electrical supply current conferring said gain on said waveguide enters a segment of the length of said waveguide constituting a gain segment, a stabilizer system comprising at least one Bragg reflector coupled to said waveguide and having lines of equal index perpendicular to the direction of said waveguide, said system being tuned to a resonant wavelength included in said gain band but outside said signal channels and including said gain segment in a resonant cavity to sustain therein optical oscillation at said wavelength, and, at least one rejector reflector coupled to said waveguide outside said resonant cavity, said rejector reflector being a Bragg reflector tuned to said resonant wavelength and having lines of equal index inclined to said direction of said waveguide to reject out of said waveguide unwanted light emitted at said wavelength by said cavity.

It has been found that some imperfections in the operation of prior art systems are related to this unwanted emission of light.

How the present invention may be put into effect is described in more detail hereinafter with reference to the appended diagrammatic drawings. If the same component appears in both figures it is identified by the same reference symbol in both figures.

DESCRIPTION OF THE PREFERRED EMBODIMENT

Figure 1:
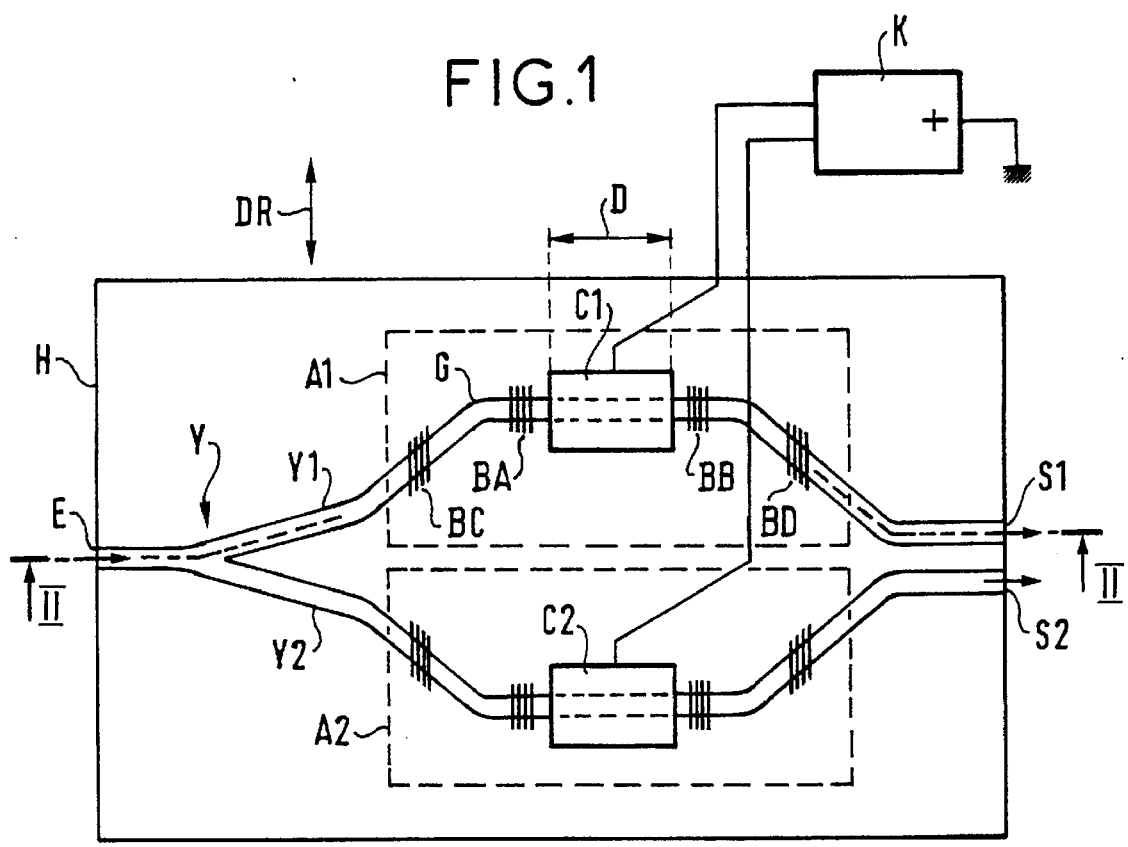
FIG. 1 is a top view of a component of the invention.
Figure 2:
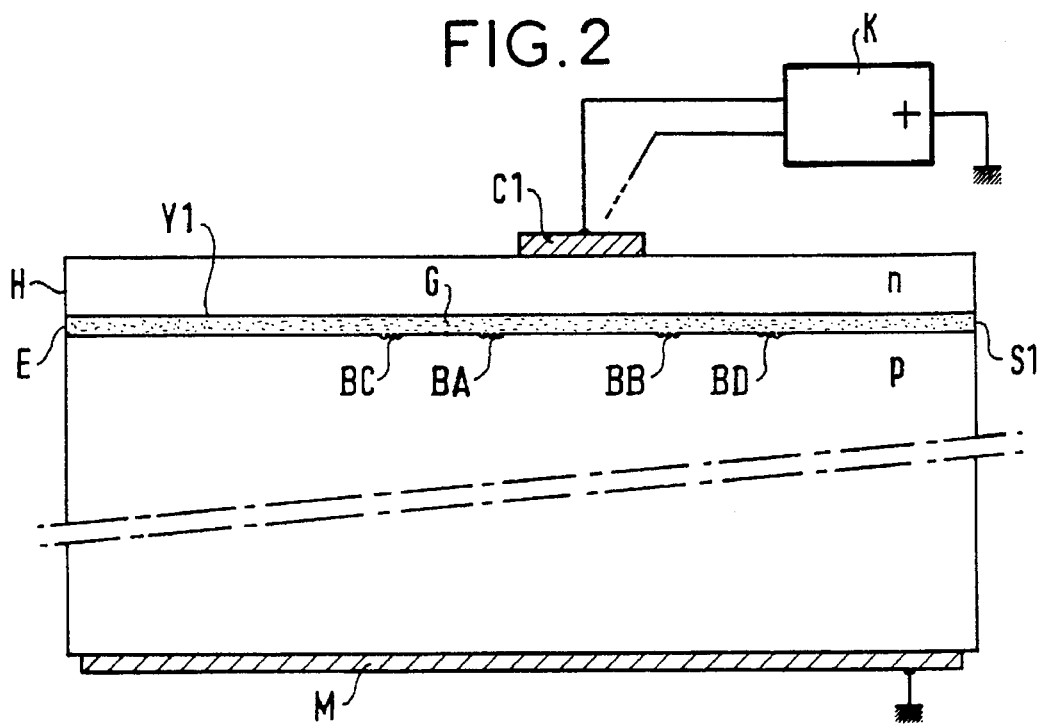
FIG. 2 shows the component from FIG. 1 in section on a line II—II along the axis of the optical waveguide of the component.

An amplifier A1 of this component includes:

A waveguide G formed in a semiconductor substrate H to guide a multiplex made up of a plurality of optical signals to be amplified occupying respective signal channels in the spectrum. This waveguide is active in the segment D, i.e., it is adapted to recombine charge carriers with two opposite conductivity types to exhibit a gain for optical waves in a spectral band constituting the gain band. This gain band includes said signal channels. This guide has a length and a direction at each point.

Two layers of two opposite conductivity types (N and P) are formed in the substrate on opposite sides of the waveguide to enable a supply electrical current to inject said charge carriers into the waveguide.

Electrodes C1 and M are provided for injecting said supply electrical current conferring said gain on the waveguide G into a segment of the length of the waveguide. This segment constitutes a gain segment D.

A stabilizer system is provided comprising two Bragg reflectors BA and BB coupled to said waveguide G and having lines of equal index perpendicular to the direction of the waveguide. This system is tuned to a resonant wavelength included in said gain band but outside said signal channels. It includes said gain segment in a resonant cavity to sustain therein optical oscillation at this wavelength. It could comprise a single such reflector extending the full length of the resonant cavity to be formed. Said oscillation is a stabilizing oscillation with amplitude variations that maintain the gain of the gain segment at a constant value, compensating the amplitude variations of the signals.

Finally, at least one Bragg type rejector reflector BC coupled to the waveguide G outside said resonant cavity. This reflector is tuned to said resonant wavelength. It has lines of equal index inclined to the direction of the waveguide to reject out of the waveguide unwanted light emitted at this wavelength by this cavity.

The lines of equal index of the stabilizer system BA, BB and of the rejector reflector BC are advantageously parallel to a common reflector direction DR. In this case the waveguide G is curved so that its direction is perpendicular to this reflector direction in the stabilizer system and inclined to this reflector direction in the rejector reflector. This arrangement has the advantage that, in making the Bragg reflectors by a prior art method which forms the lines of equal index along interference fringes formed by ultraviolet light beams, the direction of these fringes remains the same at all times, which avoids the need for delicate angular adjustments. The reflector direction relative to the monocristalline lattice of the substrate H can be optimized.

Two rejector reflectors BC, BD advantageously sandwich the resonant cavity BA, BB between them.

The present invention also consists in a multifunction semiconductor optical component. This component includes a plurality of units formed on a common semiconductor substrate H to fulfill respective functions, one of these units being an amplifier A1 of the type previously described.

One such component is a switch having an input E and two outputs S1 and S2, for example. It then comprises a passive input coupler Y the two branches Y1 and Y2 of which feed respective amplifiers A1 and A2 as previously described.

A controlled electrical power supply K feeds either the control electrode C1 of the amplifier A1 or the control electrode C2 of the amplifier A2 so that a multiplex arriving at the input E leaves either at the output S1 or at the output S2, respectively.

A component of the invention can also include an amplifier as previously described and a receiver converting the optical signals into electrical form, for example.

There is claimed:

1. A low crosstalk optical amplifier comprising:

a waveguide formed in a semiconductor substrate to guide a multiplex signal comprising a plurality of optical signals to be amplified occupying respective signal channels in a spectrum, said waveguide being adapted to recombine charge carriers of two opposite conductivity types to provide a gain for optical waves in a spectral band constituting a gain band including said signal channels, said waveguide having a length and a direction;

two layers of said two opposite conductivity types (N and P) formed in said substrate on opposite sides of said waveguide to enable a supply electrical current to inject said charge carriers into said waveguide;

electrodes through which said electrical supply current conferring said gain on said waveguide enters a segment of the length of said waveguide constituting a gain segment;

a stabilizer system comprising at least one Bragg reflector coupled to said waveguide and having lines of equal index perpendicular to the direction of said waveguide, said stabilizer system being tuned to a resonant wavelength included in said gain band but outside said signal channels and including said gain segment in a resonant cavity to sustain therein optical oscillation at said wavelength, and at least one rejector reflector coupled to said waveguide outside said resonant cavity, said rejector reflector being a Bragg reflector tuned to said resonant wavelength and having lines of equal index inclined to said direction of said waveguide to reject out of said waveguide unwanted light emitted at said wavelength by said resonant cavity.

2. An amplifier as claimed in claim 1 wherein said lines of equal index of said stabilizer system and of said rejector reflector are parallel to a common reflector direction and the direction of said waveguide is perpendicular to said reflector direction in said stabilizer system and inclined to said reflector direction in said rejector reflector.

3. An amplifier as claimed in claim 1 comprising two rejector reflectors sandwiching said resonant cavity between them.

4. A multifunction semiconductor optical component comprising a plurality of units formed on a common semiconductor substrate, wherein at least one of said units is an amplifier as claimed in claim 1.

5. A low crosstalk optical amplifier, comprising:

a waveguide formed in a semiconductor substrate to guide wavelength division multiplexed optical signals occupying respective signal channels in a spectrum;

means for providing a gain to optical signals in said waveguide in a gain band including said signal channels;

at least one Bragg grating tuned to a wavelength outside of said signal channels and inside of said gain band and included in a resonant cavity on said waveguide, and at least one rejection Bragg grating coupled to said waveguide outside of said resonant cavity for rejecting from said waveguide unwanted light having said wavelength.

* * * * *